US011652057B2

(12) United States Patent
Yong et al.

(10) Patent No.: US 11,652,057 B2
(45) Date of Patent: May 16, 2023

(54) DISAGGREGATED DIE INTERCONNECTION WITH ON-SILICON CAVITY BRIDGE

(71) Applicant: Intel Corporation, Santa Clara, CA (US)

(72) Inventors: Khang Choong Yong, Puchong (MY); Eng Huat Goh, Ayer Itam (MY); Min Suet Lim, Gelugor (MY); Robert Sankman, Phoenix, AZ (US); Telesphor Kamgaing, Chandler, AZ (US); Wil Choon Song, Bayan Lepas (MY); Boon Ping Koh, Seberang Jaya (MY)

(73) Assignee: Intel Corporation, Santa Clara, CA (US)

( * ) Notice: Subject to any disclaimer, the term of this patent is extended or adjusted under 35 U.S.C. 154(b) by 859 days.

(21) Appl. No.: 16/405,610

(22) Filed: May 7, 2019

(65) Prior Publication Data

US 2020/0357744 A1   Nov. 12, 2020

(51) Int. Cl.
| | | |
|---|---|---|
| *H01L 23/538* | (2006.01) | |
| *H01L 23/31* | (2006.01) | |
| *H01L 23/48* | (2006.01) | |
| *H01L 25/065* | (2023.01) | |

(52) U.S. Cl.
CPC ...... *H01L 23/5381* (2013.01); *H01L 23/3178* (2013.01); *H01L 23/3185* (2013.01); *H01L 23/481* (2013.01); *H01L 25/0655* (2013.01)

(58) Field of Classification Search
CPC ............. H01L 23/5381; H01L 25/0655; H01L 23/3178

USPC .......................................................... 257/668
See application file for complete search history.

(56) References Cited

U.S. PATENT DOCUMENTS

| | | | |
|---|---|---|---|
| 2008/0017971 A1 | 1/2008 | Hollis | |
| 2018/0138145 A1* | 5/2018 | Lin | ................... H01L 23/49833 |
| 2018/0197772 A1* | 7/2018 | Hollis | ............... H01L 21/76877 |
| 2020/0035603 A1* | 1/2020 | Rubin | ................. H01L 23/5381 |

FOREIGN PATENT DOCUMENTS

WO   WO-2018063154   5/2018

OTHER PUBLICATIONS

Extended European Search Report for European Application No. 20163008.4 dated Jul. 3, 2020, 9 pgs.

* cited by examiner

*Primary Examiner* — Quoc D Hoang
(74) *Attorney, Agent, or Firm* — Schwabe, Williamson & Wyatt, P.C.

(57) ABSTRACT

Embodiments disclose electronic packages with a die assembly and methods of forming such electronic packages. In an embodiment, a die assembly comprises a first die and a second die laterally adjacent to the first die. In an embodiment, the first die and the second die each comprise a first semiconductor layer, an insulator layer over the first semiconductor layer, and a second semiconductor layer over the insulator layer. In an embodiment, a cavity is disposed through the second semiconductor layer. In an embodiment, the die assembly further comprises a bridge substrate that electrically couples the first die to the second die, where the bridge is positioned in the cavity of the first die and the cavity of the second die.

25 Claims, 11 Drawing Sheets

DISAGGREGATED DIE INTERCONNECTION WITH ON-SILICON CAVITY BRIDGE

TECHNICAL FIELD

Embodiments of the present disclosure relate to electronic packaging, and more particularly, to electronic packages with disaggregated dies that are interconnected with an on-silicon cavity bridge.

BACKGROUND

As performance demands continue to advance in the semiconductor industry, there has been a drive towards die disaggregation as opposed to the use of a single monolithic die. Disaggregation of dies requires connecting multiple dies together in order to have them operate as one die. However, the interconnection of multiple dies is challenging. Particularly, package substrate manufacturing technologies currently do not provide sufficiently fine line/space capability to fabricate the interconnects on the package substrate. Several solutions have been proposed to meet the needed line/space resolution.

One such solution is the use of an embedded multi-die interconnect bridge (EMIB). EMIB architectures include embedding a bridge substrate into the package substrate. The bridge substrate may be coupled between dies and provide the needed fine line/space traces. However, embedding a bridge substrate into the package substrate is not without issue. For example, the presence of the bridge substrate requires that two to three layers of copper be removed from the package substrate to accommodate the EMIB die. The removal of theses copper layers cuts the Vccin feed-in power plane. This negatively impacts load line (LL), thus forcing an increase in the number of package layers in order to maintain adequate performance. Additionally, the EMIB die blocks via stitching between land side capacitors (LSCs) at the package bottom and the silicon die.

Another proposed solution to provide interconnection of disaggregated dies is to use a 3D die stacking architecture. However, such solutions increase the Z-height since dies are stacked over a base die. Additionally, 3D die stacking architectures are expensive to implement and have a high design complexity. Furthermore, 3D die stacking relies on through substrate vias (TSVs) to connect to the die. This constrains the power delivery path and introduces losses.

EMBODIMENTS OF THE PRESENT DISCLOSURE

Described herein are electronic packages with disaggregated dies that are interconnected by on-silicon cavity bridges, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, interconnection architectures are a critical design consideration needed to enable the disaggregation of dies. The use of EMIB and 3D die stacking has been proposed, but both architectures are limited, as described above. Accordingly, embodiments disclosed herein include interconnection architectures that utilize a bridge substrate that is removed from the package substrate. Removing the bridge substrate from the package substrate allows for a direct Vccin feed path since no copper layers need to be removed. Accordingly, the load line is improved. Instead of being located in the package substrate, embodiments disclosed herein include placing the bridge substrate in a cavity that is formed into a backside surface of the dies that are being connected together. Furthermore, since the bridge substrate is set into the cavity, there is no increase in the Z-height of the electronic package, as is the case in 3D die stacking.

Figure 1A:
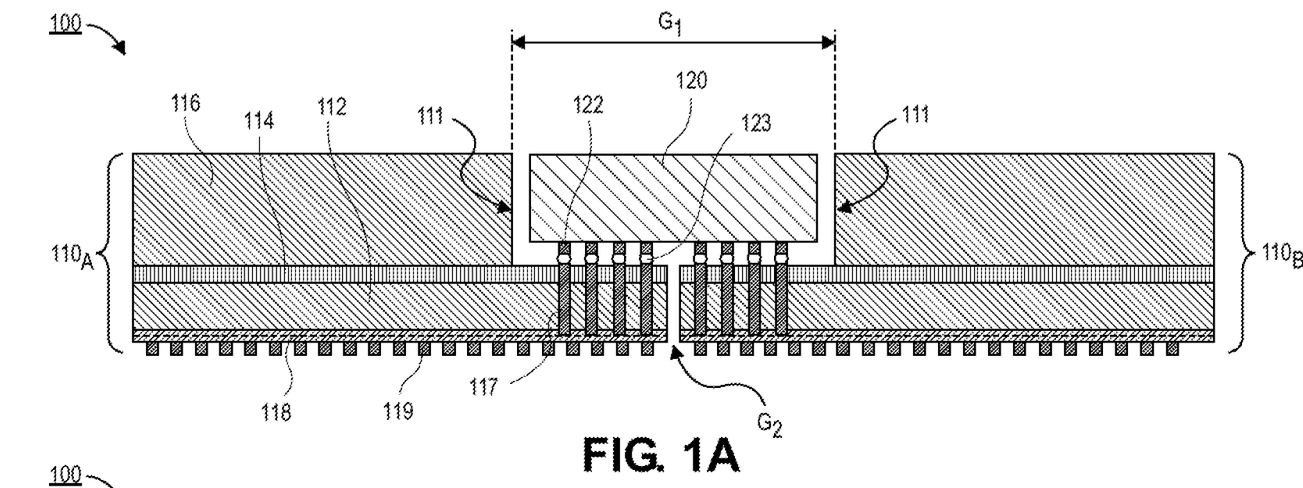
FIG. 1A is a cross-sectional illustration of a die assembly with an on-die cavity for accommodating a bridge substrate, in accordance with an embodiment.

Referring now to FIG. 1A, a cross-sectional illustration of a die assembly 100 is shown, in accordance with an embodiment. The die assembly 100 may comprise a first die 110A and a second die 110B. In an embodiment, each of the first die 110A and the second die 110B comprise a first semiconductor layer 112, an insulating layer 114, and a second semiconductor layer 116. For example, the first die 110A and the second die 110B may be referred to as silicon on insulator (SOI) dies. However, it is to be appreciated that the first semiconductor layer 112 may be any semiconductor material. For example, the first semiconductor layer 112 may comprise silicon, a III-V semiconductor material, or the like. In some embodiments, the second semiconductor layer 116 may comprise the same semiconductor material as the first semiconductor layer 112. In other embodiments, the second semiconductor layer 116 may comprise a different semiconductor material than the first semiconductor layer 112. In an embodiment, the insulator layer 114 may comprise silicon oxide or any other suitable insulating material. In an embodiment, a thickness of the second semiconductor layer 116 may be approximately equal to or greater than a thickness of the first semiconductor layer 112. Providing a larger thickness for the second semiconductor layer 116 improves the structural integrity of the die assembly 100.

In an embodiment, the first die 110A may be substantially similar to the second die 110B. For example, both the first die 110A and the second die 110B may be processor dies. In other embodiments, the first die 110A may be a different type of die than the second die 110B. For example, the first die 110A may be a processor die and the second die 110B may be a memory die, a graphics processor die, a communications die, or any other type of die.

In an embodiment, a cavity 111 may be disposed through the second semiconductor layer 116. The cavities 111 may be positioned along edges of the first die 110A and the second die 110B. The cavities 111 may expose portions of the insulating layer 114. As shown, the cavity 111 in the first die 110A may be aligned with the cavity 111 in the second die 110B. Accordingly, a first gap G1 may be provided between the second semiconductor layers 116. The first gap G1 may be larger than a second gap G2 between the first semiconductor layers 112.

In an embodiment, the first semiconductor layer 112 may comprise an active layer 118. The active layer 118 may comprise transistors, conductive routing, or the like (as indicated by the dashed line). Conductive bumps 119 may be disposed over the active layer 118. The conductive bumps 119 may be any suitable bump or interconnect architecture suitable for first level interconnects (FLIs). In an embodiment, the active layer 118 may be electrically coupled to a bottom surface of the cavity 111 by through substrate vias (TSVs) 117. The TSVs 117 may pass through the first semiconductor layer 112 and through the insulator layer 114.

In an embodiment, a bridge substrate 120 may be positioned in the first gap G1. That is, the bridge substrate 120 may extend between the cavity 111 in the first die 110A and the cavity 111 in the second die 110B. Positioning the bridge substrate 120 in the cavities 111 hides the thickness of the bridge substrate 120 so that there is no increase in the Z-height of the die assembly 100. For example, a top surface of the bridge substrate 120 may be substantially coplanar with the top surface of the second semiconductor layers 116. However, it is to be appreciated that in some embodiments, the top surface of the bridge substrate 120 may be above a top surface of the second semiconductor layers 116.

The bridge substrate 120 may be electrically coupled to the active layers 118 by the TSVs 117. For example, the bridge substrate 120 may be electrically coupled to the TSVs 117 by bumps 122 and/or balls 123. In an embodiment, the bridge substrate 120 provides electrical coupling between the first die 110A and the second die 110B. For example, the bridge substrate 120 may comprise a plurality of traces (not shown) for electrically coupling the first die 110A to the second die 110B. The bridge substrate 120 may be a silicon substrate. Accordingly, silicon processes may be used to provide traces with fine line/spacing dimensions (e.g., 2 μm/2 μm).

In some embodiments, the bridge substrate 120 may be a passive component. In other embodiments, the bridge substrate 120 may be an active component. For example, the bridge substrate 120 may comprise transistors or the like in addition to traces for electrically coupling the first die 110A to the second die 110B.

Figure 1B:
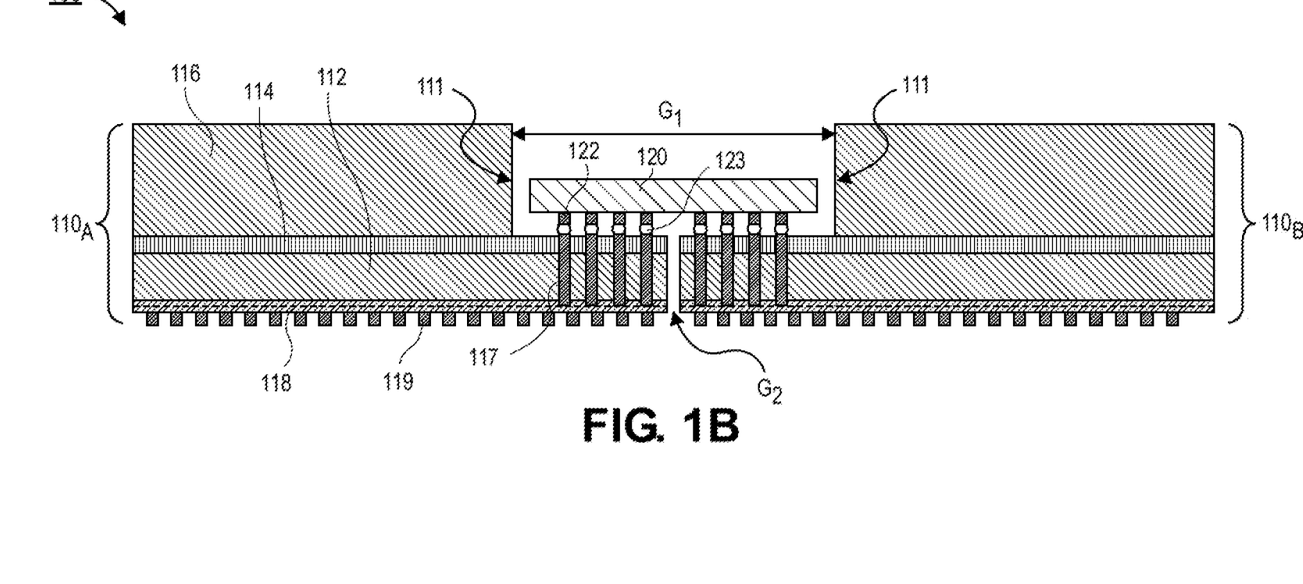
FIG. 1B is a cross-sectional illustration of a die assembly with an on-die cavity for accommodating a bridge substrate, in accordance with an additional embodiment.

Referring now to FIG. 1B a cross-sectional illustration of a die assembly 100 is shown in accordance with an additional embodiment. The die assembly 100 in FIG. 1B may be substantially similar to the die assembly 100 in FIG. 1A, with the exception that a thickness of the bridge substrate 120 is reduced. Particularly, the bridge substrate 120 may have a thickness that is less than the thickness of the second semiconductor layer 116. Accordingly, embodiments may include a bridge substrate 120 with a top surface that is below a top surface of the first die 110A and a top surface of the second die 110B.

Figure 2A:
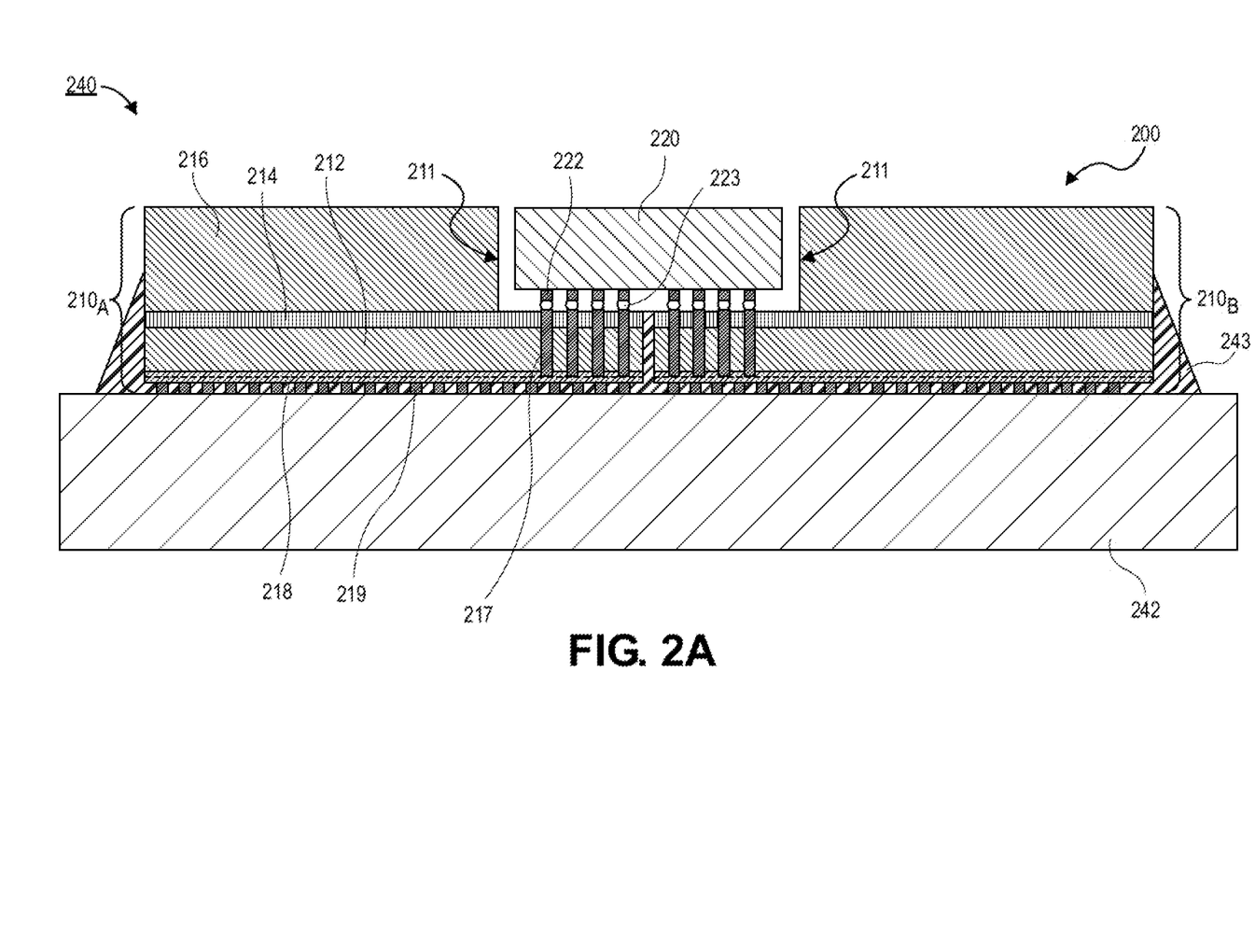
FIG. 2A is a cross-sectional illustration of an electronic package with a die assembly that comprises an on-die cavity for accommodating a bridge substrate, in accordance with an embodiment.

Referring now to FIG. 2A, a cross-sectional illustration of an electronic package 240 with a die assembly 200 is shown, in accordance with an embodiment. In an embodiment, the die assembly 200 may be electrically coupled to a package substrate 242. The die assembly 200 may be substantially similar to the die assembly 100 described above with respect to FIG. 1A. For example, a first die 210A and a second die 210B may be laterally adjacent to each other and electrically coupled together by a bridge substrate 220. The bridge substrate 220 sits in a cavity 211 through the second semiconductor layers 216. The first die 210A and the second die 210B may comprise a first semiconductor layer 212 with an active region 218, an insulating layer 214 over the first semiconductor layer 212, and a second semiconductor layer 216 over the insulating layer 214. In an embodiment, the bridge substrate 220 may be electrically coupled to the active regions 218 by bumps 222, balls 223, and TSVs 217. In an embodiment, an underfill material 243 may be disposed around and below the die assembly 200. For example, the underfill material 243 may surround bumps 219 that are electrically coupled to the package substrate 242.

Figure 2B:
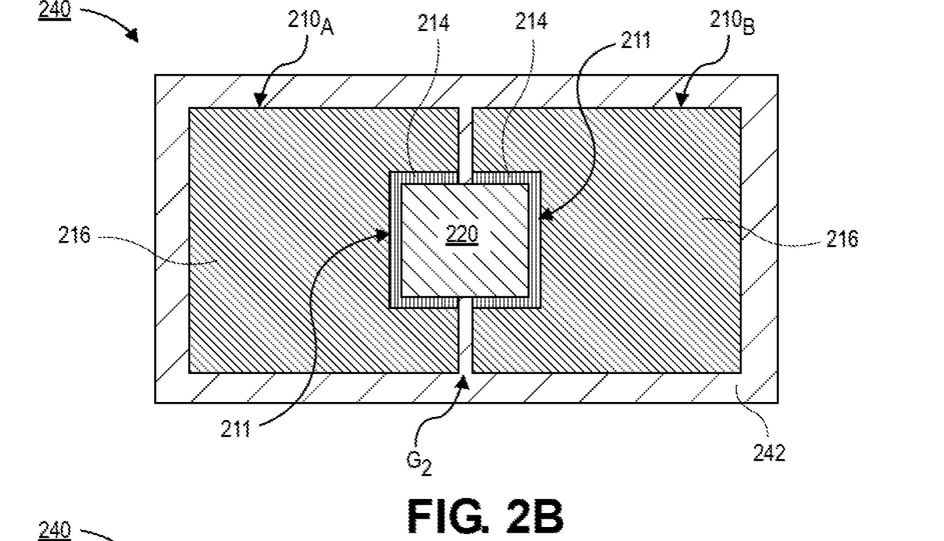
FIG. 2B is a plan view illustration of an electronic package with a pair of dies that are interconnected by a bridge substrate placed in an on-die cavity, in accordance with an embodiment.

Referring now to FIG. 2B, a plan view illustration of the electronic package 240 is shown, in accordance with an embodiment. As shown, the first die 210A and the second die 210B are laterally adjacent to each other and positioned over the package substrate 242. In an embodiment, the topmost layers (i.e., the second semiconductor layers 216) of the first die 210A and the second die 210B are shown. In an embodiment, the cavities 211 may be formed through the second semiconductor layer 216. The cavities 211 expose a portion of the insulating layer 214. As shown, the cavities 211 are along edges of the first die 210A and the second die 210B and are aligned with each other. The bridge substrate 220 is over the exposed portion of the insulating layer 214 in the cavities 211. As shown, the bridge substrate 220 extends across the second gap G2 between the first die 210A and the second die 210B.

Figure 2C:
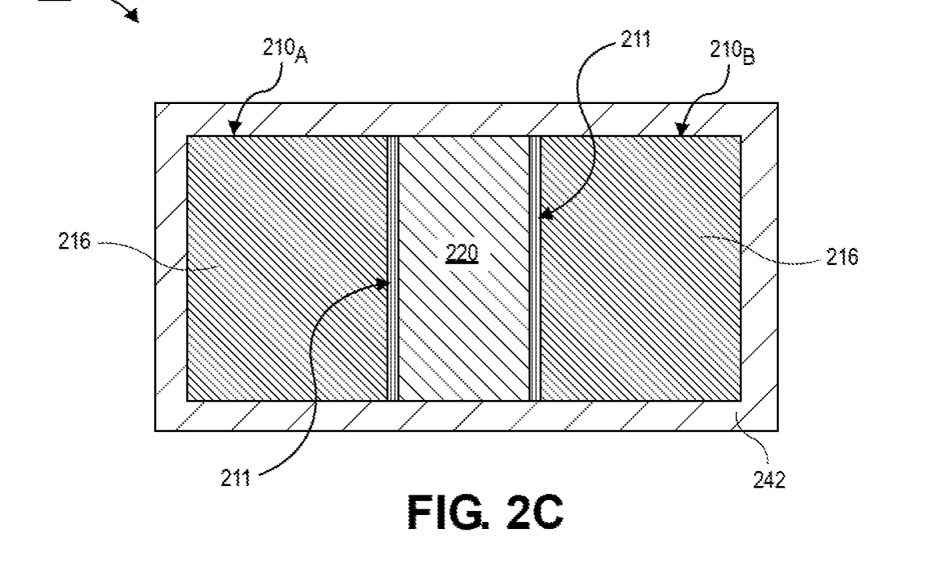
FIG. 2C is a plan view illustration of an electronic package with a pair of dies that are interconnected by a bridge that spans an entire width of the dies, in accordance with an embodiment.

Referring now to FIG. 2C, a plan view illustration of an electronic package 240 is shown, in accordance with an embodiment. In an embodiment, the electronic package 240 may be substantially similar to the electronic package 240 illustrated in FIG. 2B, with the exception that a width of the bridge substrate 220 is substantially equal to a width of the first die 210A and the second die 210B. In such an embodiment, the cavities 211 may also extend along the entire width of the first die 210A and the second die 210B. That is, the cavities 211 may only have a single vertical sidewall.

Figure 2D:
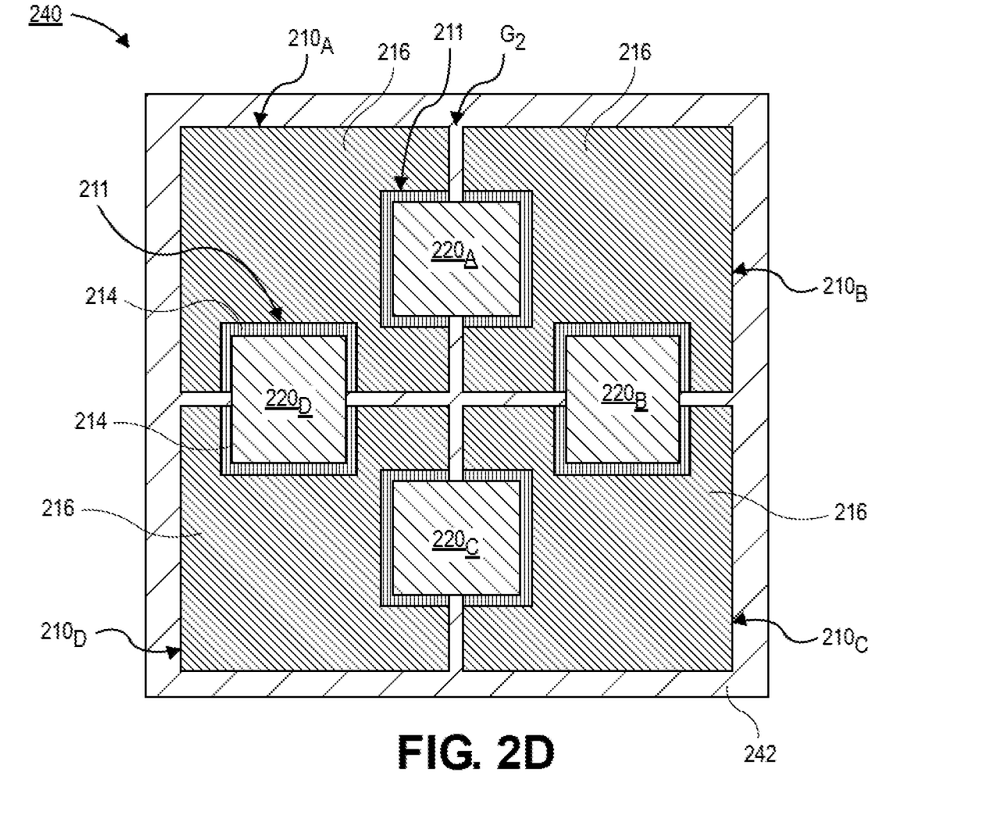
FIG. 2D is a plan view illustration of an electronic package with a plurality of dies that are interconnected by a plurality of bridge substrates that are placed in different on-die cavities, in accordance with an embodiment.

Referring now to FIG. 2D, a plan view illustration of an electronic package 240 is shown, in accordance with an additional embodiment. As shown, the electronic package 240 may comprise a plurality of dies 210A-D that are laterally adjacent to each other. While four dies 210A-D are shown, it is to be appreciated that the electronic package may comprise any number of dies 210. In an embodiment, each of the dies 210A-D may be electrically coupled to an adjacent die 210A-D by a bridge substrate 220A-D. Particularly, each die 210A-D may have more than one cavity 211 in order to accommodate more than one bridge substrate 220. For example, the first die 210A is electrically coupled to the second die 210B with a first bridge substrate 220A, and the first die 210A is also electrically coupled to the fourth die 210D with a fourth bridge substrate 220D.

Figure 2E:
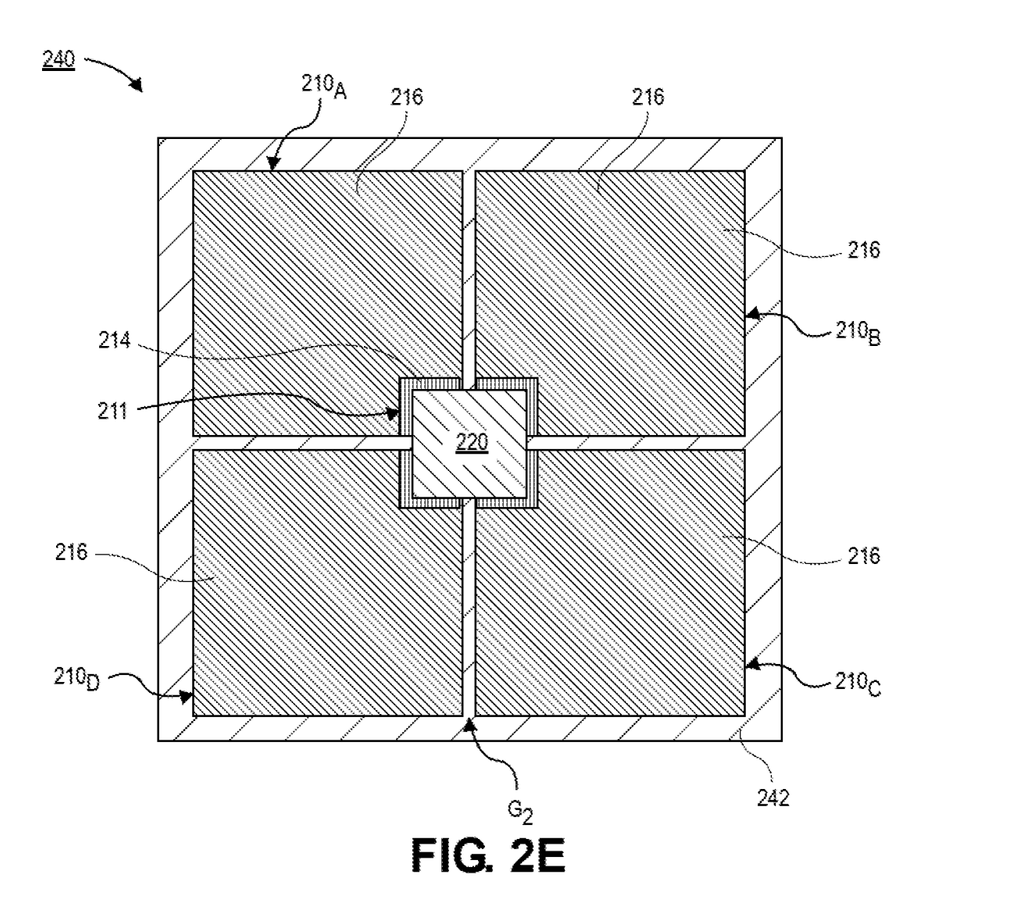
FIG. 2E is a plan view illustration of an electronic package with a plurality of dies that are interconnected by a single bridge substrate, in accordance with an embodiment.

Referring now to FIG. 2E, a plan view illustration of an electronic package 240 is shown, in accordance with an additional embodiment. In an embodiment, the electronic package 240 may comprise a plurality of dies 210A-D. Each of the dies 210A-D may be interconnected with a single bridge substrate 220. That is, the bridge substrate 220 may rest in a cavity 211 formed into a portion of each of the dies 210A-D.

Referring now to FIGS. 3A-3F, a series of cross-sectional illustrations depicting a process for forming an electronic package is shown, in accordance with an embodiment.

Figure 3A:
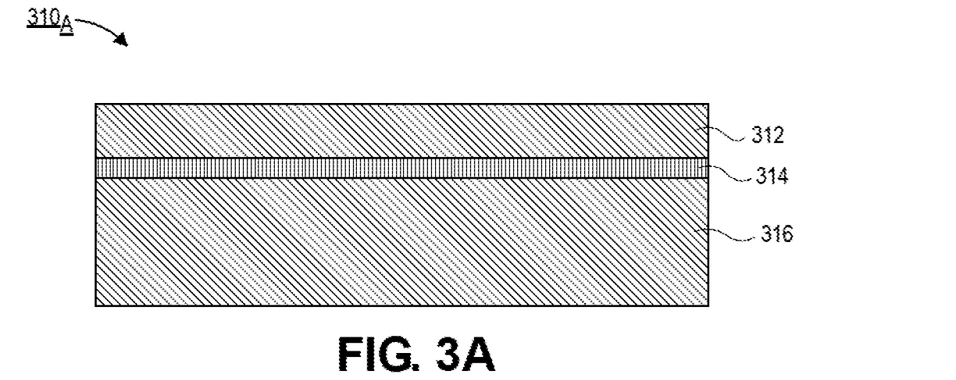
FIG. 3A is a cross-sectional illustration of a die that comprises a first semiconductor layer, an insulator layer, and a second semiconductor layer, in accordance with an embodiment.

Referring now to FIG. 3A, a cross-sectional illustration of a first die 310A is shown, in accordance with an embodiment. In an embodiment, the first die 310A comprises a first semiconductor layer 312 and second semiconductor layer 316. An insulating layer 314 may separate the first semiconductor layer 312 from the second semiconductor layer 316. The first die 310A may be referred to as a SOI die. In an embodiment, the first semiconductor layer 312 may comprise the same semiconductor material as the second semiconductor layer 316. In other embodiments, the first semiconductor layer 312 may comprise a different semiconductor material than the second semiconductor layer 316. In a particular embodiment, the first semiconductor layer 312 comprises silicon or a III-V semiconductor. In the illustration shown in FIG. 3A, only a single first die 310A is shown for simplicity. However, it is to be appreciated that the first die 310A may be part of a larger substrate (e.g., a wafer) that comprises a plurality of dies 310.

Figure 3B:
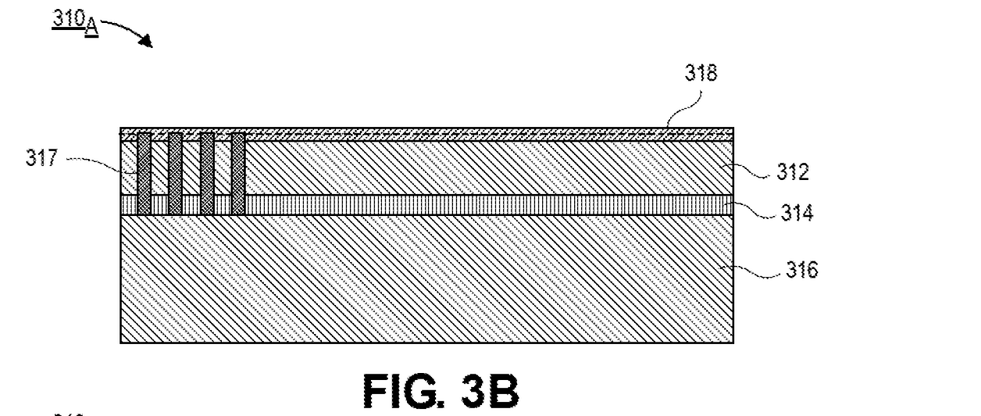
FIG. 3B is a cross-sectional illustration of the die after an active surface is fabricated on the first semiconductor layer, in accordance with an embodiment.

Referring now to FIG. 3B, a cross-sectional illustration of the first die 310A after an active region 318 is formed over the first semiconductor layer 312 is shown, in accordance with an embodiment. In an embodiment, the active region 318 may comprise transistors and/or routing (as indicated by the dashed line). In an embodiment, TSVs 317 may also be formed into the first die 310A. The TSVs 317 may extend through the first semiconductor layer 312 and through the insulating layer 314. The TSVs 317 may be electrically coupled to the active region 318 (e.g., the transistors and/or routing). The formation of the active region 318 and the TSVs 317 may be implemented with standard semiconductor manufacturing operations known to those skilled in the art.

Figure 3C:
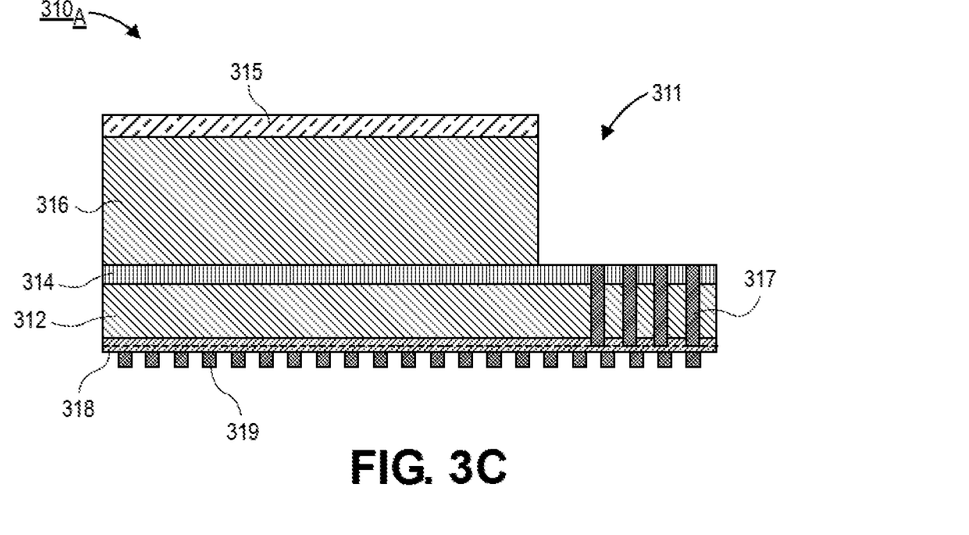
FIG. 3C is a cross-sectional illustration of the die after a cavity through the second semiconductor layer is formed, in accordance with an embodiment.

Referring now to FIG. 3C, a cross-sectional illustration after a cavity 311 is formed into the first die 310A is shown, in accordance with an embodiment. The first die 310A illustrated in FIG. 3C is flipped relative to the first die 310A illustrated in FIG. 3B. That is, the second semiconductor layer 316 is facing up. In an embodiment, the cavity 311 may be formed with a lithography process. For example, a mask layer 315 may be disposed over a portion of the surface of the second semiconductor layer 316. The exposed portions of the second semiconductor layer 316 are etched away to form the cavity 311. For example, the etching process may include a reactive ion etching (RIE) or any other suitable etching process. The cavity 311 exposes a portion of the insulating layer 314 and the TSVs 317. In an embodiment, bumps 319 may also be disposed over the active surface 318. The bumps 319 may be disposed before or after the formation of the cavity 311. After the formation of the cavity 311, the first die 310A may be singulated from the wafer.

Figure 3D:
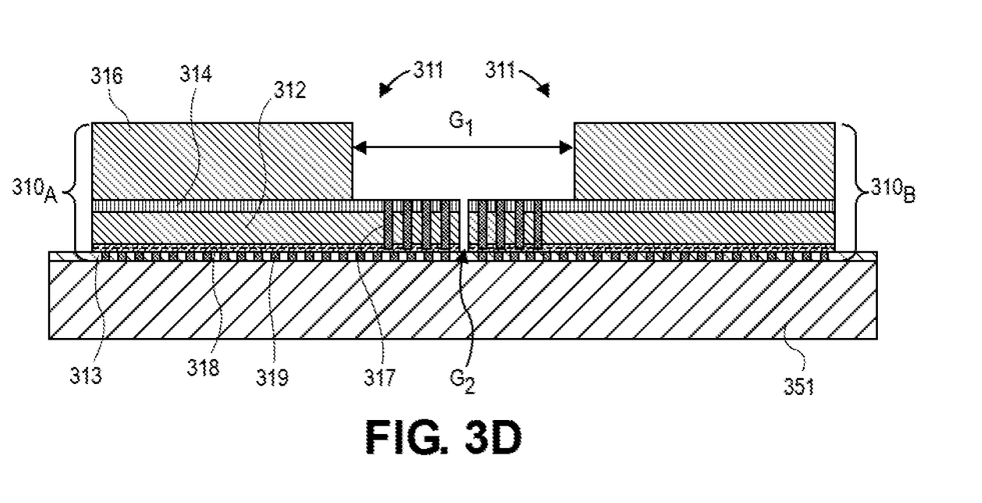
FIG. 3D is a cross-sectional illustration after a first die and a second die are mounted to a carrier so that on-die cavities are aligned with each other, in accordance with an embodiment.

Referring now to FIG. 3D, a cross-sectional illustration after the first die 310A and a second die 310B are attached to a carrier 351 is shown, in accordance with an embodiment. The first die 310A and the second die 310B may be attached to the carrier 351 with an adhesive 313 or the like. In an embodiment, the second die 310B may be formed with substantially the same processing operations used to fabricate the first die 310A. In some embodiments, the first die 310A and the second die 310B may be fabricated on the same wafer. In other embodiments, the first die 310A and the second die 310B may be fabricated on different wafers. For example, the first die 310A may be a processor die and the second die 310B may be a memory die, a graphics die, a communication die, or any other die.

In an embodiment, the first die 310A may be positioned laterally adjacent to the second die 310B and spaced apart from each other by a gap. For example, a first gap G1 may separate the second conductive layer 316 of the first die 310A from the second conductive layer 316 of the second die 310B. A second gap G2 may separate the first semiconductor layer 312 of the first die 310A from the first semiconductor layer 312 of the second die 310B. In an embodiment, the second gap G2 is smaller than the first gap G1.

Figure 3E:
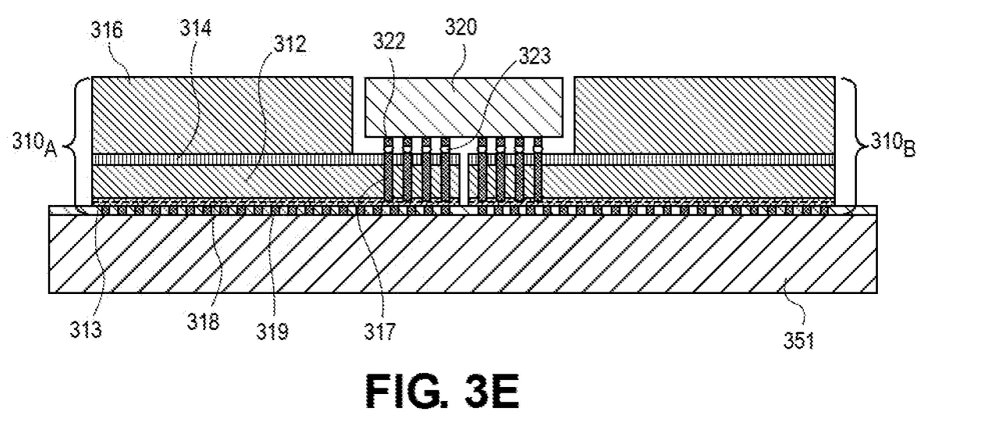
FIG. 3E is a cross-sectional illustration after a bridge substrate is placed in the cavity and attached to the first die and the second die, in accordance with an embodiment.

Referring now to FIG. 3E, a cross-sectional illustration after the bridge substrate 320 is attached to the first die 310A and the second die 310B is shown, in accordance with an embodiment. In an embodiment, the bridge substrate 320 is placed in the cavities 311. The bridge substrate 320 is electrically coupled to the TSVs 317 with bumps 322 and balls 323.

Figure 3F:
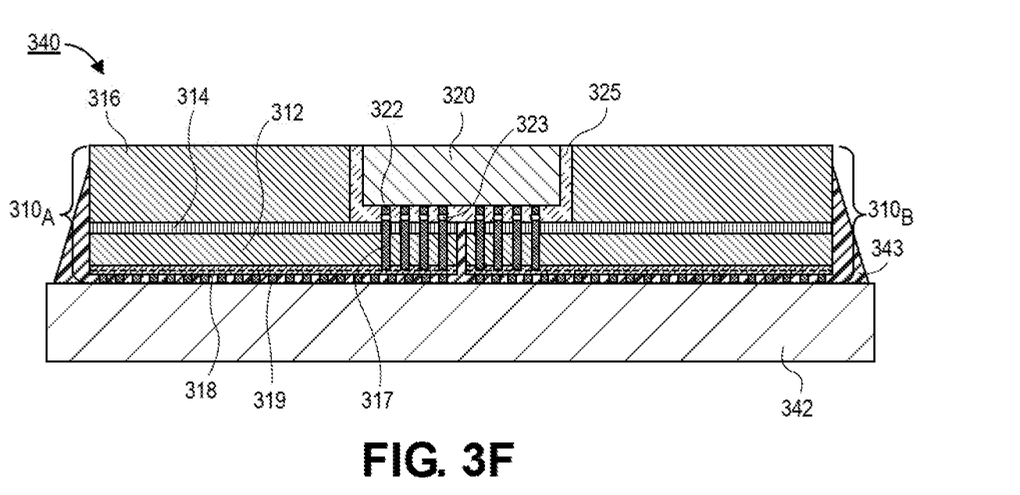
FIG. 3F is a cross-sectional illustration after the cavity is filled with a cavity fill material and the die assembly is transferred from the carrier to a package substrate, in accordance with an embodiment.

Referring to FIG. 3F, a cross-sectional illustration after the die assembly is transferred to a package substrate 342 to provide an electronic package 340 is shown, in accordance with an embodiment. The die assembly may be mounted to the package substrate 342 using the bumps 319. An underfill material 343 may be disposed under and around the first die 310A and the second die 310B. In an embodiment, the bridge substrate 320 may also be embedded in a molding material 325. For example, the molding material 325 may be an epoxy or the like. While the processing flow above includes mounting the die assembly to a carrier 351 prior to mounting to the package substrate 342, embodiments are not limited to such process flows. For example, the use of a carrier 351 may be omitted, and the first die 310A and the second die 310B may be mounted to the package substrate 342. In such embodiments, the bridge substrate 320 may be attached to the first die 310A and the second die 310B after the first die 310A and the second die 310B are secured to the package substrate 342.

Referring now to FIGS. 4A-4D, a series of cross-sectional illustrations depict a process for assembling an electronic package 440 with a thin bridge substrate 420 is shown, in accordance with an embodiment.

Figure 4A:
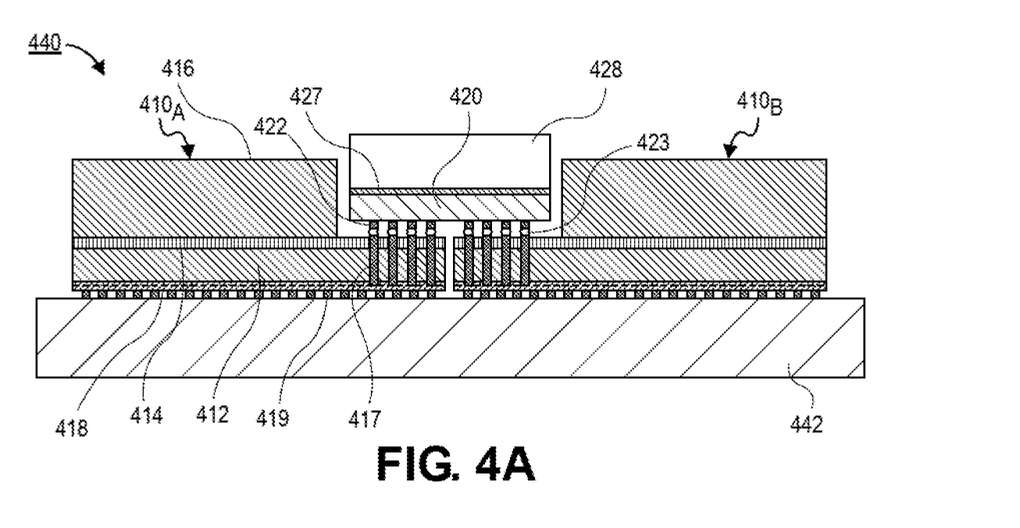
FIG. 4A is a cross-sectional illustration of an electronic package with a die assembly having a thin bridge substrate with a carrier is shown, in accordance with an embodiment.

Referring now to FIG. 4A, a cross-sectional illustration of an electronic package 440 with a first die 410A and a second die 410B attached to a package substrate 442 by bumps 419 is shown, in accordance with an embodiment. In an embodiment, the first die 410A and the second die 410B may be substantially similar to the dies described above. For example, they may comprise a first semiconductor layer 412, an insulating layer 414, and a second semiconductor layer 416. An active region 418 may be coupled to TSVs 417 that extend up to a bottom surface of a cavity.

In an embodiment, a bridge substrate 420 may be placed into the cavity and provide electrical coupling between the first die 410A and the second die 410B. For example, bumps 422 and balls 423 may electrically couple the bridge substrate 420 to the TSVs 417. In a particular embodiment, the bridge substrate 420 may have a thickness that is less than the thickness of the second semiconductor layer 416. Using a thin bridge substrate 420 prevents a portion of the bridge substrate 420 extending above the top surfaces of the second semiconductor layers 416. However, thin substrates are more fragile than thicker substrates. Accordingly, the thin bridge substrate 420 may require additional layers and processing in order to attach the bridge substrate 420 to the electronic package 440.

In order to provide reliable integration of a thin bridge substrate 420 into the electronic package 440, the bridge substrate 420 may be attached to a carrier 428. In an embodiment, the carrier 428 may be attached to the bridge substrate 420 with an adhesive 427. The carrier 428 may have a thickness and stiffness sufficient to allow bonding of the bridge substrate 420 to the first die 410A and the second die 410B. For example, a top surface of the carrier 428 may extend above top surfaces of the second semiconductor layers 416 of the first die 410A and the second die 410B.

Figure 4B:
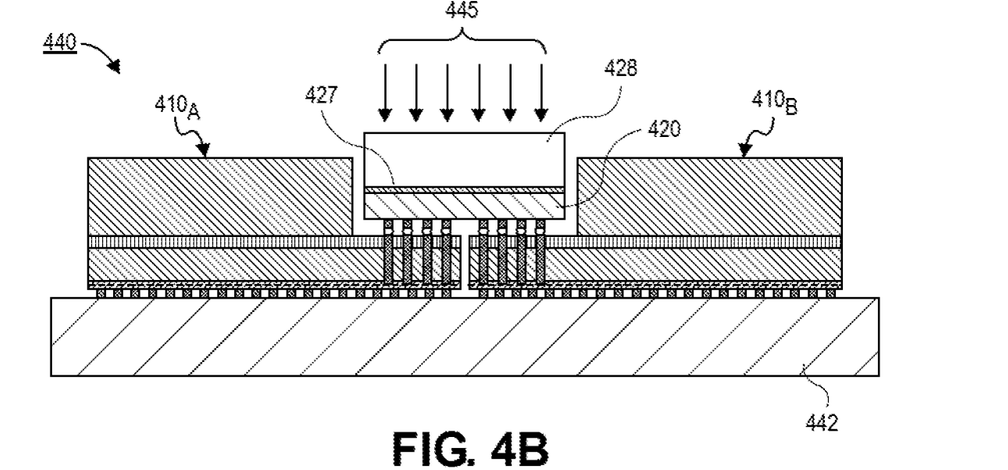
FIG. 4B is a cross-sectional illustration of the electronic package as ultraviolet (UV) light is propagated through the bridge substrate carrier, in accordance with an embodiment.

Referring now to FIG. 4B, a cross-sectional illustration of the electronic package 440 during a process for separating the carrier 428 from the bridge substrate 420 is shown, in accordance with an embodiment. As shown, electromagnetic radiation 445 may be propagated through the carrier 428 to interact with the adhesive 427. For example, the carrier 428 may be a material that is transparent to ultraviolet (UV) radiation, such as glass. In an embodiment, the adhesive 427 may be an adhesive that is dissolved by ultraviolet (UV) radiation in order to release the carrier 428 from the bridge substrate 420.

Figure 4C:
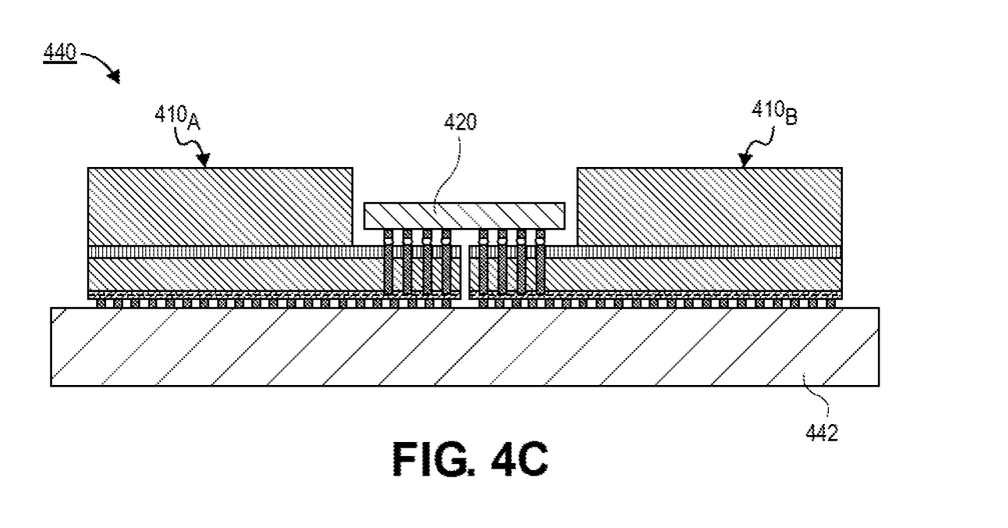
FIG. 4C is a cross-sectional illustration of the electronic package after the bridge substrate carrier is removed, in accordance with an embodiment.

Referring now to FIG. 4C, a cross-sectional illustration of the electronic package 440 after the carrier 428 is removed from the bridge substrate 420 is shown, in accordance with an embodiment. In an embodiment, the bridge substrate 420 remains in the cavity after the removal of the carrier 428. Particularly, since the bridge substrate 420 is a thin substrate, a top surface of the bridge substrate 420 is below top surfaces of the first die 410A and the second die 410B.

Figure 4D:
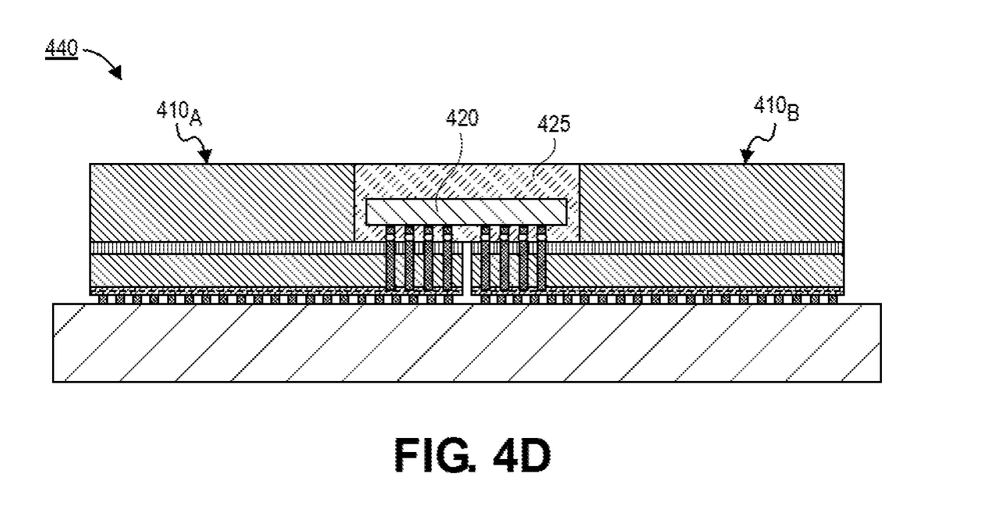
FIG. 4D is a cross-sectional illustration of the electronic package after a cavity fill material is disposed to embedded the bridge substrate, in accordance with an embodiment.

Referring now to FIG. 4D, a cross-sectional illustration after a fill material 425 is disposed in the cavity is shown, in accordance with an embodiment. In an embodiment, the fill material 425 completely embeds the bridge substrate 420. That is, sidewalls and a top surface of the bridge substrate 420 may be covered by the fill material 425. In an embodiment, the fill material 425 may be any suitable material, such as an epoxy or the like.

Figure 5:
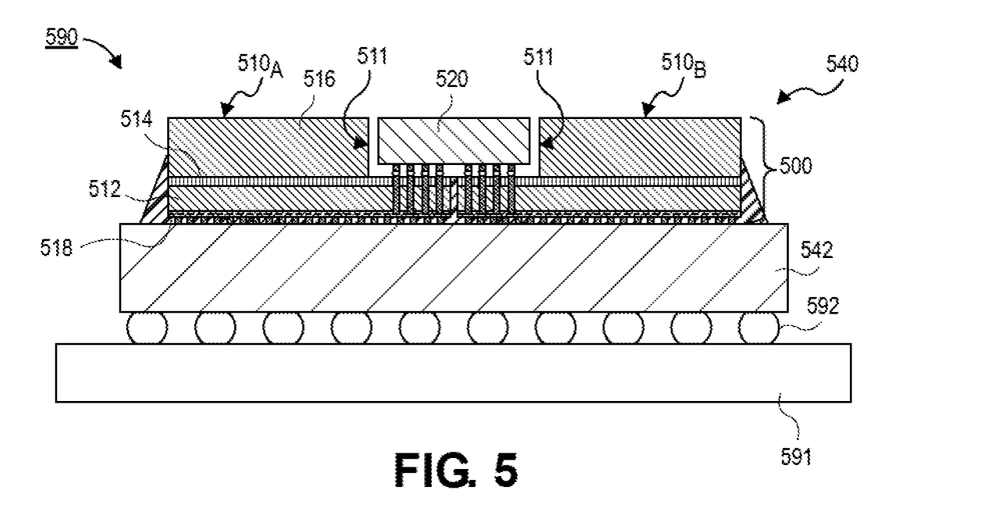
FIG. 5 is a cross-sectional illustration of an electronic system comprising a plurality of dies electrically coupled together by a bridge substrate in an on-die cavity, in accordance with an embodiment.

Referring now to FIG. 5, a cross-sectional illustration of an electronic system 590 is shown, in accordance with an embodiment. In an embodiment, the electronic system 590 may comprise a board 591, such as a printed circuit board (PCB), a motherboard, or the like. In an embodiment, an electronic package 540 may be electrically coupled to the board 591 with interconnects 592. In an embodiment, the electronic package 540 may be substantially similar to the electronic packages such as those described above. For example, the electronic package 540 may comprise a package substrate 542 and a die assembly 500 attached to the package substrate 542.

In an embodiment, the die assembly 500 comprises a first die 510A, a second die 510B, and a bridge substrate 520 placed in cavities 511 in the first die 510A and the second die 510B. Each of the first die 510A and the second die 510B may comprise a first semiconductor layer 512, an insulating layer 514, and a second semiconductor layer 516. The cavities 511 are formed through the second semiconductor layer 516 and expose a portion of the insulating layer 514. In an embodiment, active regions 518 are located in the first semiconductor layer 512 that faces the package substrate 542.

Figure 6:
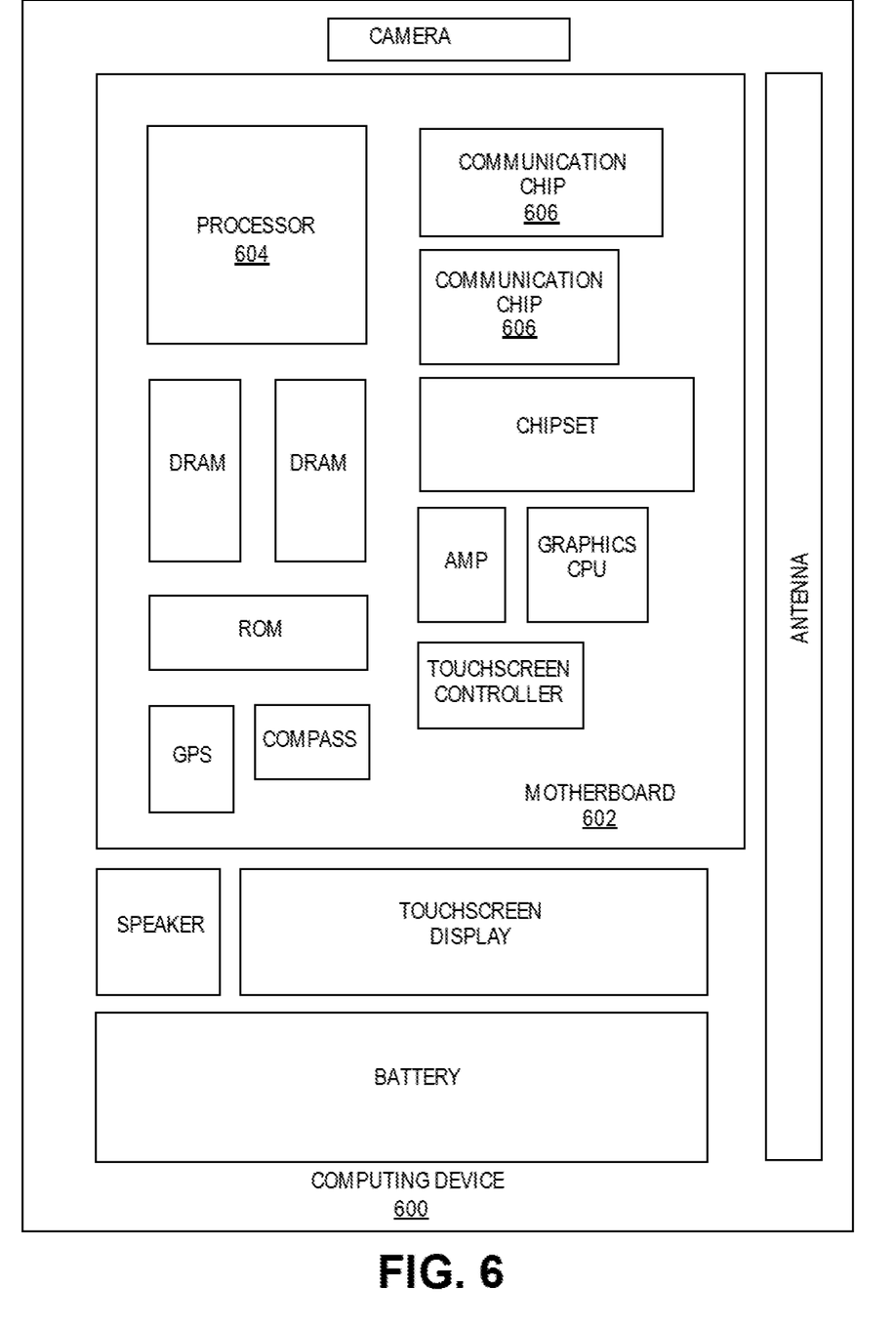
FIG. 6 is a schematic of a computing device built in accordance with an embodiment.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor may be packaged in an electronic system that comprises a die assembly with a first die, a second die, and a bridge substrate set in cavities in the first die and the second die, and where the bridge substrate electrically couples the first die to the second die, in accordance with embodiments described herein. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip may be packaged in an electronic system that comprises a die assembly with a first die, a second die, and a bridge substrate set in cavities in the first die and the second die, and where the bridge substrate electrically couples the first die to the second die, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a die assembly, comprising: a first die; a second die laterally adjacent to the first die, wherein the first die and the second die each comprise: a first semiconductor layer; an insulator layer over the first semiconductor layer; a second semiconductor layer over the insulator layer; a cavity disposed through the second semiconductor layer; and a bridge substrate that electrically couples the first die to the second die, wherein the bridge is positioned in the cavity of the first die and the cavity of the second die.

Example 2: the die assembly of Example 1, wherein the cavity of the first die is along a first edge of the first die, and wherein the cavity of the second die is along a first edge of the second die.

Example 3: the die assembly of Example 2, wherein the first edge of the first die faces the first edge of the second die.

Example 4: the die assembly of Examples 1-3, wherein the first die and the second die further comprise: an active region in the first semiconductor layer.

Example 5: die assembly of Example 4, wherein the active region is electrically coupled to the bridge by through substrate vias (TSVs) that pass through the first semiconductor layer and the insulator layer.

Example 6: the die assembly of Examples 1-5, wherein the first semiconductor layer and the second semiconductor layer comprise the same semiconductor material.

Example 7: the die assembly of Examples 1-6, wherein the first semiconductor layer comprises silicon or a III-V semiconductor system.

Example 8: the die assembly of Examples 1-7, wherein a thickness of the first semiconductor layer is smaller than a thickness of the second semiconductor layer.

Example 9: the die assembly of Examples 1-8, wherein the bridge substrate is a passive component.

Example 10: the die assembly of Examples 1-8, wherein the bridge substrate is an active component.

Example 11: an electronic package, comprising: a package substrate; a die assembly coupled to the package substrate, wherein the die assembly comprises: a first die; a second die adjacent to the first die; a cavity into the first die and the second die; and a bridge substrate in the cavity, wherein the bridge substrate electrically couples the first die to the second die.

Example 12: the electronic package of Example 11, wherein the each of the first die and the second die comprise an active surface, wherein the active surfaces face the package substrate.

Example 13: the electronic package of Example 12, wherein the active surfaces are electrically coupled to the bridge substrate by through substrate vias (TSVs) that end at a bottom surface of the cavity.

Example 14: the electronic package of Example 13, wherein the bottom surface of the cavity comprises an insulator.

Example 15: the electronic package of Example 11-14, wherein each of the first die and the second die comprise: a first semiconductor layer; an insulator over the first semiconductor layer; and a second semiconductor layer, wherein the cavity is through the second semiconductor layer.

Example 16: the electronic package of Example 15, wherein the first semiconductor layer and the second semiconductor layer comprise the same semiconductor material.

Example 17: the electronic package of Example 15, wherein the first semiconductor layer and the second semiconductor layer comprise different semiconductor material.

Example 18: the electronic package of Examples 11-17, wherein a fill material encapsulates the bridge substrate and fills the cavity.

Example 19: the electronic package of Examples 11-18, wherein a top surface of the bridge substrate is below top surfaces of the first die and the second die.

Example 20: the electronic package of Examples 11-19, wherein the bridge substrate is a passive component.

Example 21: the electronic package of Examples 11-19, wherein the bridge substrate is an active component.

Example 22: an electronic system, comprising: a board; a package substrate electrically coupled to the board; and a die assembly electrically coupled to the package substrate, wherein the die assembly comprises: a plurality of dies, wherein the dies in the plurality of dies are laterally adjacent to each other; a bridge substrate electrically coupling dies together, wherein the bridge substrate is positioned in a cavity that spans across neighboring dies.

Example 23: the electronic system of Example 22, wherein the plurality of dies comprises a first die and a second die.

Example 24: the electronic system of Example 22 or Example 23, wherein the plurality of dies comprises more than two dies, and wherein the die assembly further comprises a plurality of bridge substrates, wherein each of the bridge substrates is in a different cavity that spans across neighboring dies.

Example 25: the electronic system of Examples 22-24, wherein each die in the plurality of dies comprises: a first semiconductor layer, wherein an active surface of the die is in the first semiconductor layer; an insulator layer over the first semiconductor layer; and a second semiconductor layer over the insulator layer, wherein the cavity is through the second semiconductor layer.

What is claimed is:

1. A die assembly, comprising:
   a first die;
   a second die laterally adjacent to the first die, wherein the first die and the second die each comprise:
      a first semiconductor layer;
      an insulator layer over the first semiconductor layer;
      a second semiconductor layer over the insulator layer;
      a cavity disposed through the second semiconductor layer; and
   a bridge substrate that electrically couples the first die to the second die, wherein the bridge substrate is positioned in the cavity of the first die and the cavity of the second die.

2. The die assembly of claim 1, wherein the cavity of the first die is along a first edge of the first die, and wherein the cavity of the second die is along a first edge of the second die.

3. The die assembly of claim 2, wherein the first edge of the first die faces the first edge of the second die.

4. The die assembly of claim 1, wherein the first die and the second die further comprise:
   an active region in the first semiconductor layer.

5. The die assembly of claim 4, wherein the active region is electrically coupled to the bridge substrate by through substrate vias (TSVs) that pass through the first semiconductor layer and the insulator layer.

6. The die assembly of claim 1, wherein the first semiconductor layer and the second semiconductor layer comprise the same semiconductor material.

7. The die assembly of claim 1, wherein the first semiconductor layer comprises silicon or a III-V semiconductor system.

8. The die assembly of claim 1, wherein a thickness of the first semiconductor layer is smaller than a thickness of the second semiconductor layer.

9. The die assembly of claim 1, wherein the bridge substrate is a passive component.

10. The die assembly of claim 1, wherein the bridge substrate is an active component.

11. An electronic package, comprising:
    a package substrate;
    a die assembly coupled to the package substrate, wherein the die assembly comprises:
       a first die;
       a second die adjacent to the first die;
       a cavity into the first die and the second die; and
       a bridge substrate in the cavity, wherein the bridge substrate electrically couples the first die to the second die.

12. The electronic package of claim 11, wherein the each of the first die and the second die comprise an active surface, wherein the active surfaces face the package substrate.

13. The electronic package of claim 12, wherein the active surfaces are electrically coupled to the bridge substrate by through substrate vias (TSVs) that end at a bottom surface of the cavity.

14. The electronic package of claim 13, wherein the bottom surface of the cavity comprises an insulator.

15. The electronic package of claim 11, wherein each of the first die and the second die comprise:
    a first semiconductor layer;
    an insulator over the first semiconductor layer; and
    a second semiconductor layer, wherein the cavity is through the second semiconductor layer.

16. The electronic package of claim 15, wherein the first semiconductor layer and the second semiconductor layer comprise the same semiconductor material.

17. The electronic package of claim 15, wherein the first semiconductor layer and the second semiconductor layer comprise different semiconductor material.

18. The electronic package of claim 11, wherein a fill material encapsulates the bridge substrate and fills the cavity.

19. The electronic package of claim 11, wherein a top surface of the bridge substrate is below top surfaces of the first die and the second die.

20. The electronic package of claim 11, wherein the bridge substrate is a passive component.

21. The electronic package of claim 11, wherein the bridge substrate is an active component.

22. The electronic system, comprising:
    a board;
    a package substrate electrically coupled to the board; and
    a die assembly electrically coupled to the package substrate, wherein the die assembly comprises:
       a plurality of dies, wherein the dies in the plurality of dies are laterally adjacent to each other;
       a bridge substrate electrically coupling dies together, wherein the bridge substrate is positioned in a cavity that spans across neighboring dies.

23. The electronic system of claim 22, wherein the plurality of dies comprises a first die and a second die.

24. The electronic system of claim 22, wherein the plurality of dies comprises more than two dies, and wherein the die assembly further comprises a plurality of bridge substrates, wherein each of the bridge substrates is in a different cavity that spans across neighboring dies.

25. The electronic system of claim 22, wherein each die in the plurality of dies comprises:
    a first semiconductor layer, wherein an active surface of the die is in the first semiconductor layer;
    an insulator layer over the first semiconductor layer; and
    a second semiconductor layer over the insulator layer, wherein the cavity is through the second semiconductor layer.

* * * * *